US009016107B2

(12) United States Patent
Qin et al.

(10) Patent No.: US 9,016,107 B2
(45) Date of Patent: Apr. 28, 2015

(54) METHOD OF CALIBRATING A CONSTANT VOLTAGE SUPPLY FOR AN ULTRASONIC TRANSDUCER OF A WIRE BONDING MACHINE

(75) Inventors: Ivy Wei Qin, Lansdale, PA (US); John D. Molnar, Ambler, PA (US); Thomas J. Colosimo, Jr., Cheltenham, PA (US)

(73) Assignee: Kulicke & Soffa Industries, Inc., Fort Washington, PA (US)

( * ) Notice: Subject to any disclaimer, the term of this patent is extended or adjusted under 35 U.S.C. 154(b) by 711 days.

(21) Appl. No.: 12/746,563

(22) PCT Filed: Dec. 21, 2007

(86) PCT No.: PCT/US2007/088482
§ 371 (c)(1),
(2), (4) Date: Jul. 21, 2010

(87) PCT Pub. No.: WO2009/085035
PCT Pub. Date: Jul. 9, 2009

(65) Prior Publication Data
US 2011/0056267 A1    Mar. 10, 2011

(51) Int. Cl.
*G01N 29/30*    (2006.01)
*B06B 1/02*    (2006.01)

(52) U.S. Cl.
CPC .................... *B06B 1/0223* (2013.01)

(58) Field of Classification Search
CPC ............. B06B 1/0223; B06B 2201/72; B06B 2201/40

USPC .................................................. 73/1.82, 1.86
See application file for complete search history.

(56) References Cited

U.S. PATENT DOCUMENTS

| 2,598,134 | A | * | 5/1952 | Schade ......................... 327/139 |
| 3,445,750 | A |   | 5/1969 | Uthe et al. |
| 3,472,063 | A |   | 10/1969 | Branson |
| 3,636,456 | A |   | 1/1972 | Wright |
| 3,694,621 | A | * | 9/1972 | Wofsey ..................... 219/124.03 |
| 3,760,204 | A | * | 9/1973 | Yester, Jr. ................. 310/313 B |
| 4,696,425 | A |   | 9/1987 | Landes |
| 5,357,423 | A |   | 10/1994 | Weaver et al. |
| 5,500,824 | A | * | 3/1996 | Fink .............................. 365/201 |
| 6,236,276 | B1 |  | 5/2001 | Cewers |

FOREIGN PATENT DOCUMENTS

EP    1014575 A    6/2000

OTHER PUBLICATIONS

International Search Report dated Mar. 2, 2009, International Application No. PCT/US2007/088482.

* cited by examiner

*Primary Examiner* — Laura Martin
*Assistant Examiner* — Alex Devito
(74) *Attorney, Agent, or Firm* — Stradley Ronon Stevens & Young, LLP

(57) ABSTRACT

A method of calibrating a voltage for use with an ultrasonic transducer of a wire bonding machine in a constant voltage mode is provided. The method includes: (1) determining an impedance value associated with operation of the ultrasonic transducer; and (2) establishing an adjusted voltage level for use with the ultrasonic transducer in the constant voltage mode based on the determined impedance value.

20 Claims, 4 Drawing Sheets

METHOD OF CALIBRATING A CONSTANT VOLTAGE SUPPLY FOR AN ULTRASONIC TRANSDUCER OF A WIRE BONDING MACHINE

CROSS REFERENCE

This application claims the benefit of International Application No. PCT/US2007/088482 filed Dec. 21, 2007, the contents of which is incorporated herein by reference.

FIELD OF THE INVENTION

The present invention relates to the application of energy to an ultrasonic transducer of a wire bonding machine, and more particularly, to improved methods of applying a constant voltage to an ultrasonic transducer.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

As is known to those skilled in the art, these energy sources are not applied in a mutually exclusive way. For example, thermosonic energy typically involves the application of heat (e.g., from a heat block) and ultrasonic energy (e.g., from an ultrasonic transducer). When using ultrasonic energy in connection with wire bonding, there are generally two forms of ultrasonic output control: constant current control mode, where the current applied to the transducer is held constant (or is held to a predefined current profile) while the voltage may be varied; and constant voltage control mode, where the voltage applied to the transducer is held constant (or is held to a predefined voltage profile) while the current may be varied. In some applications, a constant power mode has also been used.

Many early wire bonder platforms used constant voltage mode in open loop control of current (i.e., the voltage applied is at a constant level regardless of the impedance variation of the system). Later wire bonder platforms adopted constant current control mode which allowed for more of a closed loop control. That is, the current may be fed back to a control board, whereby the voltage is adjusted to keep the desired current.

As is known to those skilled in the art, a benefit of constant current control mode is that it enables "portability" between one wire bonding system/machine and another. That is, the displacement of the transducer (and hence the capillary) is proportional to the current of the system. Therefore, in order to achieve similar bonding results (e.g., ball diameter, ball shear, etc.) for systems with different impedance values, supplying the same current to the transducer often yields acceptable results. One drawback of the constant current mode is that when a resonant frequency of the transducer is close a resonant frequency of the bonding components (e.g., a first bond die pad, a second bond lead of a leadframe), the impedance of the system may change significantly (e.g., the impedance may increase significantly). In a constant current control mode the system will attempt to adjust to this change in impedance by changing the voltage output (e.g., the voltage will significantly increase to account for a significant increase in impedance). For example, this may result in an increase to the overall energy put into the bond, which in turn may cause inconsistency in bonding (e.g., over squashed bonds, second bond short tail inconsistency, etc.).

In contrast, constant voltage control mode desirably limits the energy output to the bond when there is a resonance problem, and as such, the bonding results tend to be much more consistent. Unfortunately, a draw back of constant voltage control mode is a general lack of portability. Since the impedance of the systems are not the same (e.g., due to the mechanical differences of the transducer, coupling differences between the transducer and the mounting structure, mounting differences between the transducer and the capillary, etc.), the impedance from system to system may vary considerably (e.g., one system impedance may be 20 ohms, while another system impedance may be 50 ohms). Thus, when using the constant voltage control mode, the system with a lower impedance undesirably results in more energy being applied to the bonds than a higher impedance system.

As such, there are clear limitations in both the conventional constant current and constant voltage control modes. Thus, it would be desirable to provide improved methods of applying a constant voltage to an ultrasonic transducer of a wire bonding machine.

SUMMARY OF THE INVENTION

According to an exemplary embodiment of the present invention, a method of calibrating a voltage for use with an ultrasonic transducer of a wire bonding machine in a constant voltage mode is provided. The method includes: (1) determining an impedance value associated with operation of the ultrasonic transducer; and (2) establishing an adjusted voltage level for use with the ultrasonic transducer in the constant voltage mode based on the determined impedance value.

The methods of the present invention may also be embodied as an apparatus (e.g., as part of the intelligence of a wire bonding machine), or as computer program instructions on a computer readable carrier (e.g., a computer readable carrier used in connection with a wire bonding machine).

According to another exemplary embodiment of the present invention, a wire bonding system is provided. The wire bonding system includes an ultrasonic transducer and a controller. The controller is configured to (1) determine an impedance value associated with operation of the ultrasonic transducer, and (2) establish an adjusted voltage level for use with the ultrasonic transducer in a constant voltage mode based on the determined impedance value.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

In accordance with certain exemplary embodiments of the present invention, a constant voltage control mode is used to provide energy to an ultrasonic transducer of a wire bonding system. The constant voltage is preferred in certain applications, for example, because constant voltage mode tends to be less sensitive to poor lead finger clamping and lead finger resonance conditions, amongst other potential issues. In order to overcome portability issues with conventional constant voltage control modes, the impedance of the ultrasonic transducer (and/or the impedance associated with the operation of the ultrasonic transducer) may be used to normalize the amplitude output of the voltage.

By using the improved constant voltage mode described herein, a number of advantages are achieved including, for example, improved second bond on applications with lead fingers that are subject to resonance while still maintaining machine to machine portability and compensating for changes in system impedance due to wear and time effects.

As used herein, the term "controller" is intended to be broadly defined as a portion of a wire bonding system/machine including one or more of a number of functions, such as: signal generation for transmission to the ultrasonic transducer, signal amplification of the generated signal, machine software functionality, control board components, logic, etc. Thus, it is clear that the term controller is not intended to be limited to any specific component of a wire bonding system.

In the present application, the impedance associated with operation of an ultrasonic transducer is described. As is known to those skilled in the art, the impedance associated with the operation of an ultrasonic transducer is an impedance value at a frequency at which the transducer may operate. This is typically at or near a resonant frequency of the ultrasonic transducer (as is known to those skilled in the art, an ultrasonic transducer may have multiple resonant frequencies). The impedance associated with the operation of the ultrasonic transducer may involve impedance components from the transducer itself, impedance from the mounting of the transducer, etc.

Figure 1:
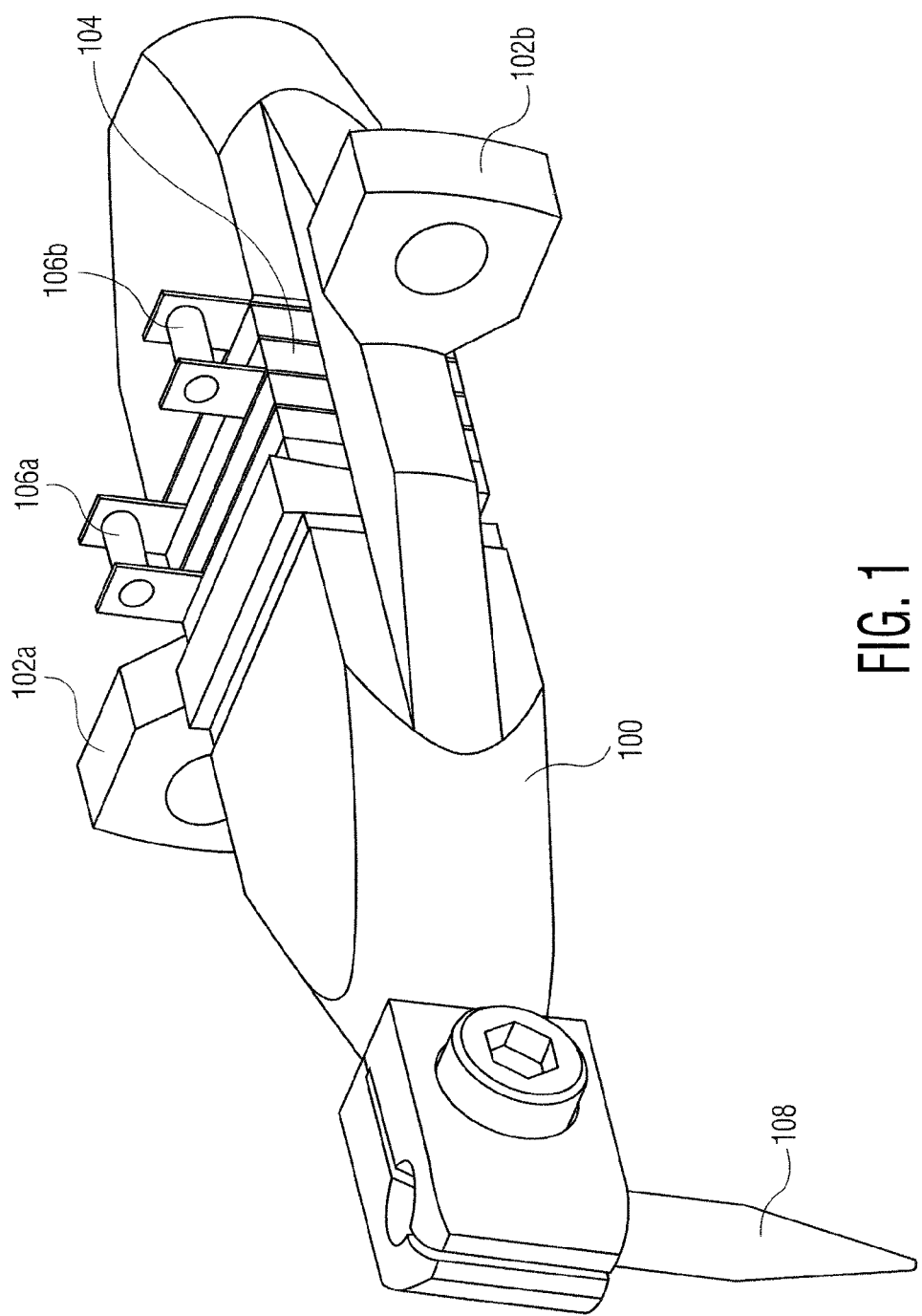
FIG. 1 is a perspective view of a transducer of a wire bonding machine and related components in accordance with an exemplary embodiment of the present invention.

FIG. 1 is a perspective view of ultrasonic transducer 100. Transducer 100 includes mounting flanges 102a and 102b used to mount transducer 100 to a bond head of a wire bonding machine. Piezoelectric crystals 104 are provided in a cavity defined by transducer 100, where crystals 104 provide ultrasonic energy to transducer 100 via the application of electrical energy to electrodes 106a and 106b. This ultrasonic energy is transmitted to bonding tool 108 which is used in wire bonding, stud bumping and the like.

Figure 2:
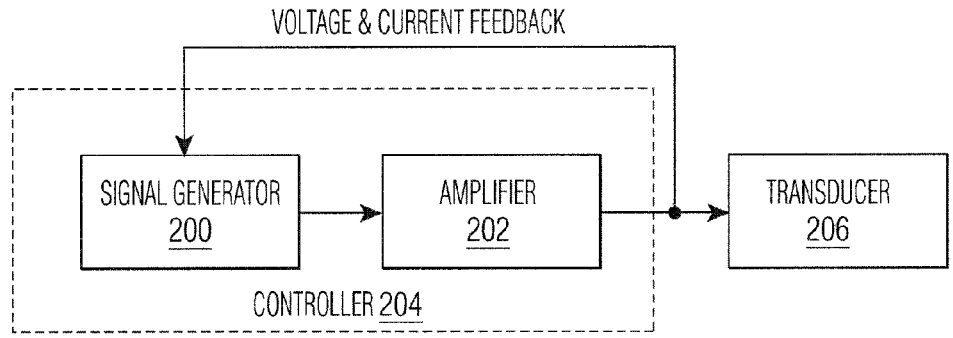
FIG. 2 is a block circuit diagram useful in understanding methods of determining an impedance value associated with operation of an ultrasonic transducer in accordance with an exemplary embodiment of the present invention.

FIG. 2 is a block circuit diagram useful in understanding methods of determining an impedance value associated with operation of an ultrasonic transducer in accordance with an exemplary embodiment of the present invention. More specifically, in order to find a resonant frequency of an ultrasonic system (and therefore, to determine an impedance value associated with operation of the ultrasonic system), controller 204 includes signal generator 200 and amplifier 202. Signal generator 200 produces a sinusoidal output signal which is swept over a wide frequency range including a resonant frequency of the ultrasonic transducer. This sinusoidal output signal is amplified by amplifier 202, and then this amplified signal is sent to transducer 206. A feedback signal (e.g., a feedback signal related to the voltage and current of the signal running through the transducer) is sent to controller 204. Controller 204 maintains a constant voltage during the frequency sweep. During this process, controller 204 monitors the feedback signal to determine when the frequency of the signal approaches a resonant frequency of the ultrasonic system. Of course, there are numerous methods by which a resonant frequency may be sensed.

In a first example, the feedback signal may be monitored to sense an increase in current. When the current in the system reaches a maximum (i.e., of course, there may be multiple current peaks or "maximums" for a given ultrasonic system, but there may be only one targeted current maximum in the frequency sweep of the signal), the controller determines that a resonant frequency has been reached. At this frequency, the voltage and current are sampled and used to determine the ultrasonic system impedance at the resonant frequency.

In a second example, the feedback signal may be monitored to sense the phase difference between the voltage and current. When the phase difference is approximately zero (i.e., the voltage and current are "in phase"), the controller determines that a resonant frequency has been reached. At this frequency, the voltage and current are sampled and used to determine the ultrasonic system impedance at the resonant frequency.

Regardless of the technique utilized, the resonant frequency is sensed by the controller, and then the impedance associated with the operation of the ultrasonic transducer is determined. After the ultrasonic system impedance is determined, it may be used to adjust the voltage that will be applied to the ultrasonic transducer in a constant voltage control mode. For example, FIG. 3 is a block circuit diagram useful in understanding methods of calibrating a voltage for use with an ultrasonic transducer of a wire bonding machine in a constant voltage mode in accordance with an exemplary embodiment of the present invention.

Figure 3:
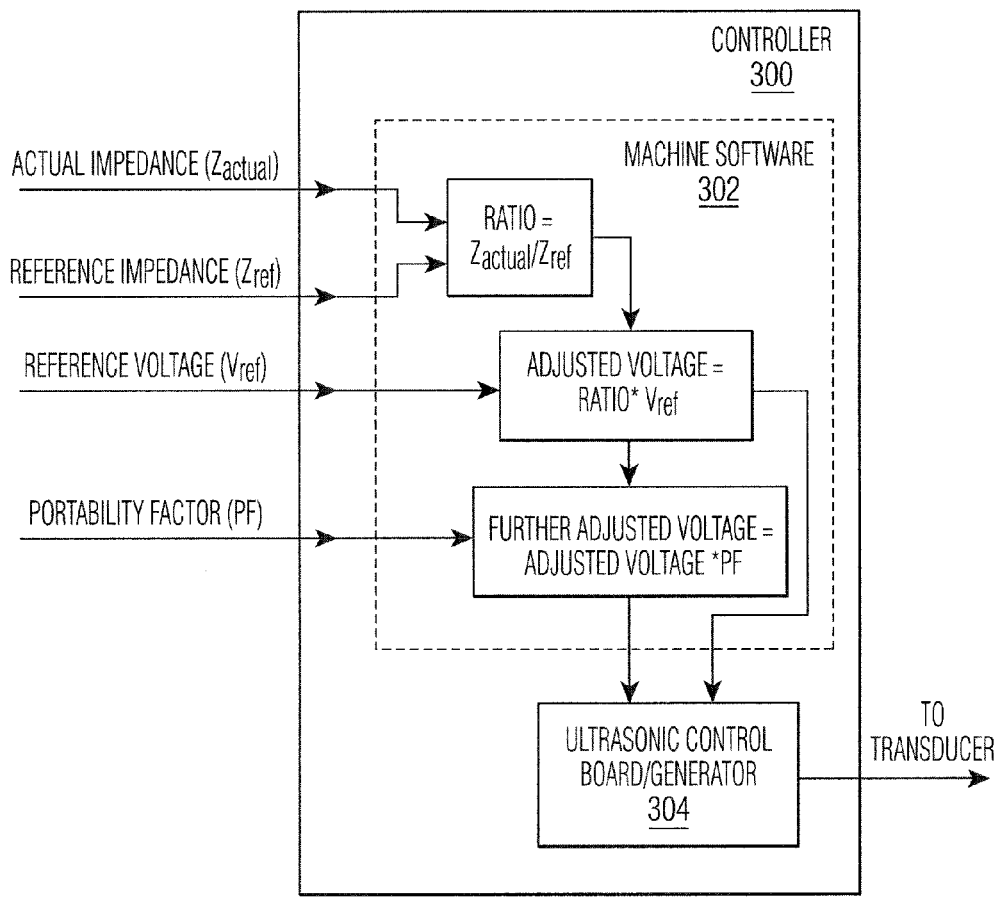
FIG. 3 is a block circuit diagram useful in understanding methods of calibrating a voltage for use with an ultrasonic transducer of a wire bonding machine in a constant voltage mode in accordance with an exemplary embodiment of the present invention.

Referring now to FIG. 3, controller 300 includes various elements such as machine software 302 and ultrasonic control board/generator 304. Machine software 302 has access to a reference impedance ($Z_{ref}$) and a reference voltage ($V_{ref}$). For example, the reference impedance and reference voltage may represent values for a known/representative system. Thus, the reference impedance is a predetermined value which is an impedance value associated with operation of a known/representative ultrasonic transducer. The reference voltage is a voltage value that has been used in conjunction with a constant voltage mode of the known/representative ultrasonic transducer. For example, the reference impedance and the reference voltage values may be stored in memory of a wire bonding machine, or may be entered into the wire bonding machine (e.g., by a user entering the values using a graphical user interface or the like).

Machine software 302 also has access to the actual impedance value ($Z_{actual}$) associated with operation of the subject ultrasonic transducer. For example, the actual impedance value ($Z_{actual}$) may be determined as described above with respect to FIG. 2.

Machine software 302 establishes/calculates a ratio of the actual impedance to the reference impedance value ($Z_{actual}/Z_{ref}$), and the machine software subsequently applies this ratio to the reference voltage to provide an adjusted voltage level. This adjusted voltage level may be the adjusted voltage level used by ultrasonic control board/generator 304; however, as shown in FIG. 3, a portability factor may also be applied to the adjusted voltage level to reach a further adjusted level. For example, such a portability factor may be determined based on empirical testing/data related to the subject transducer, where the portability factor is related to the gain/sensitivity of the ultrasonic system. That is, if a certain input is applied to the ultrasonic transducer, is the output the desired output? Or is there a loss, such as an ultrasonic crystal loss, which makes the use of a portability factor desirable? An example illustrates the function of the block diagram of FIG. 3 quite well.

In this example, the goal is to determine the voltage to be applied to a subject ultrasonic transducer in a constant voltage mode. This may be a one-time determination (e.g., at the start-up of the wire bonding machine) or this may be a repetitive or cyclical determination. Assume that previous testing of a reference ultrasonic system at a resonant frequency of 120 KHz yields reference impedance and reference voltage values as follows: $Z_{ref}$=30 ohms; and $V_{ref}$=10 volts. Through an operation such as that described above with respect to FIG. 2, an actual impedance associated with operation of the ultrasonic transducer is determined to be $Z_{actual}$=40 ohms. Machine software 302 determines that the ratio is 1.33 (i.e., $Z_{actual}/Z_{ref}$=40/30=1.33). Thus, this ratio is applied $V_{ref}$, whereby an adjusted voltage value is determined to be 13.3 volts (i.e., Adjusted voltage=($V_{ref}$*Ratio)=(10 volts*1.33)= 13.3 volts). This adjusted voltage may be communicated to ultrasonic control board/generator 304, through which a constant voltage of 13.3 volts is applied to the subject ultrasonic transducer.

Alternatively, a portability factor (PF) may be applied to the adjusted voltage. For example, using empirical testing, it may be determined the subject ultrasonic system has a certain loss by which it is desirable to provide a portability factor of 1.05. Thus, the adjusted voltage (13.3 volts) is multiplied by the portability factor (1.05) to provide a further adjusted voltage of 13.965 volts. This adjusted voltage may be communicated to ultrasonic control board/generator 304, through which a constant voltage of 13.965 volts is applied to the subject ultrasonic transducer.

Figure 4:
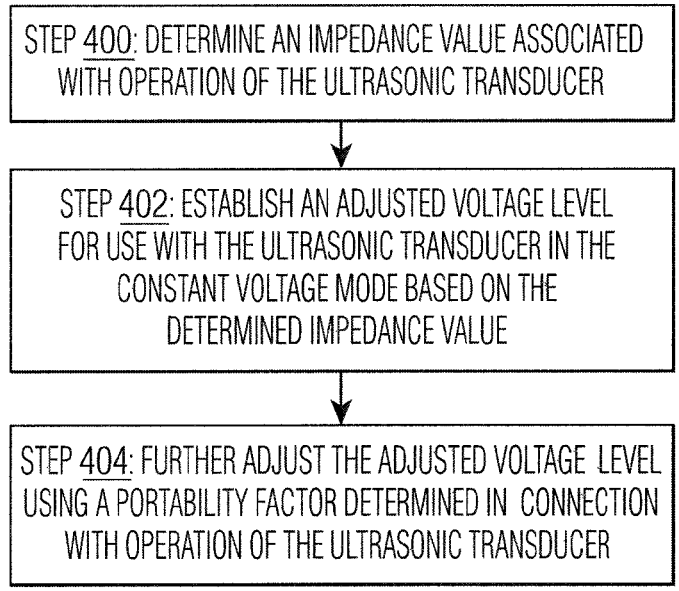
FIG. 4 is a flow diagram illustrating a method of calibrating a voltage for use with an ultrasonic transducer of a wire bonding machine in a constant voltage mode in accordance with an exemplary embodiment of the present invention.
Figure 5:
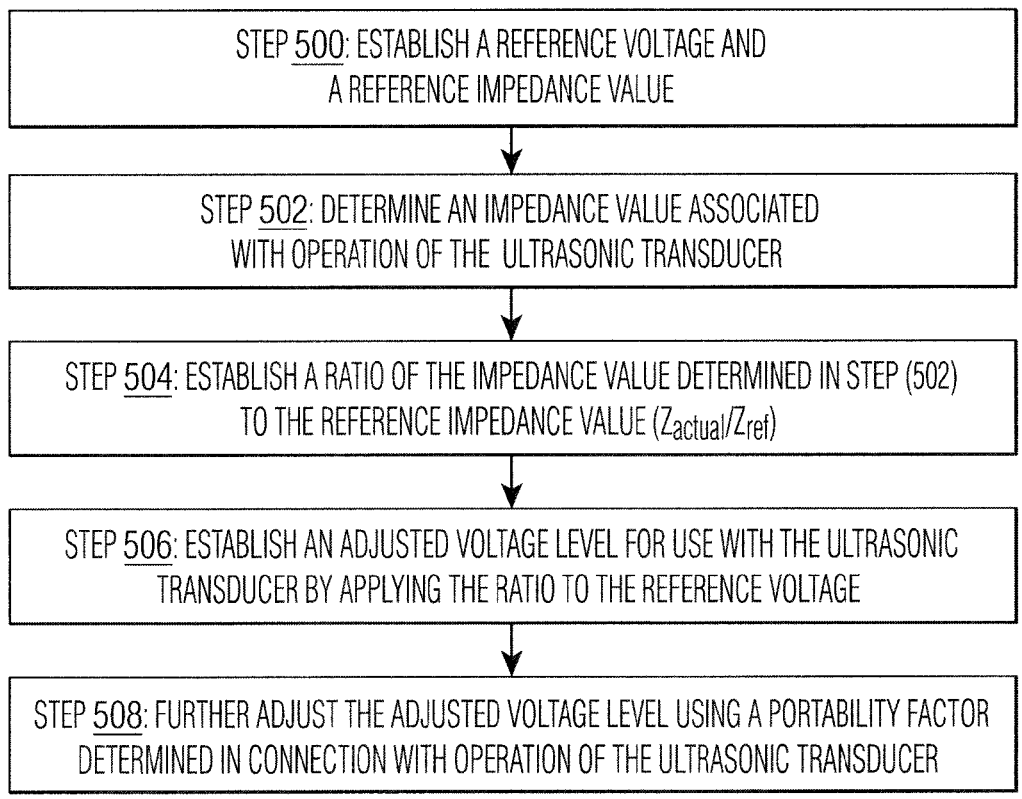
FIG. 5 is a flow diagram illustrating another method of calibrating a voltage for use with an ultrasonic transducer of a wire bonding machine in a constant voltage mode in accordance with an exemplary embodiment of the present invention.
Figure 6:
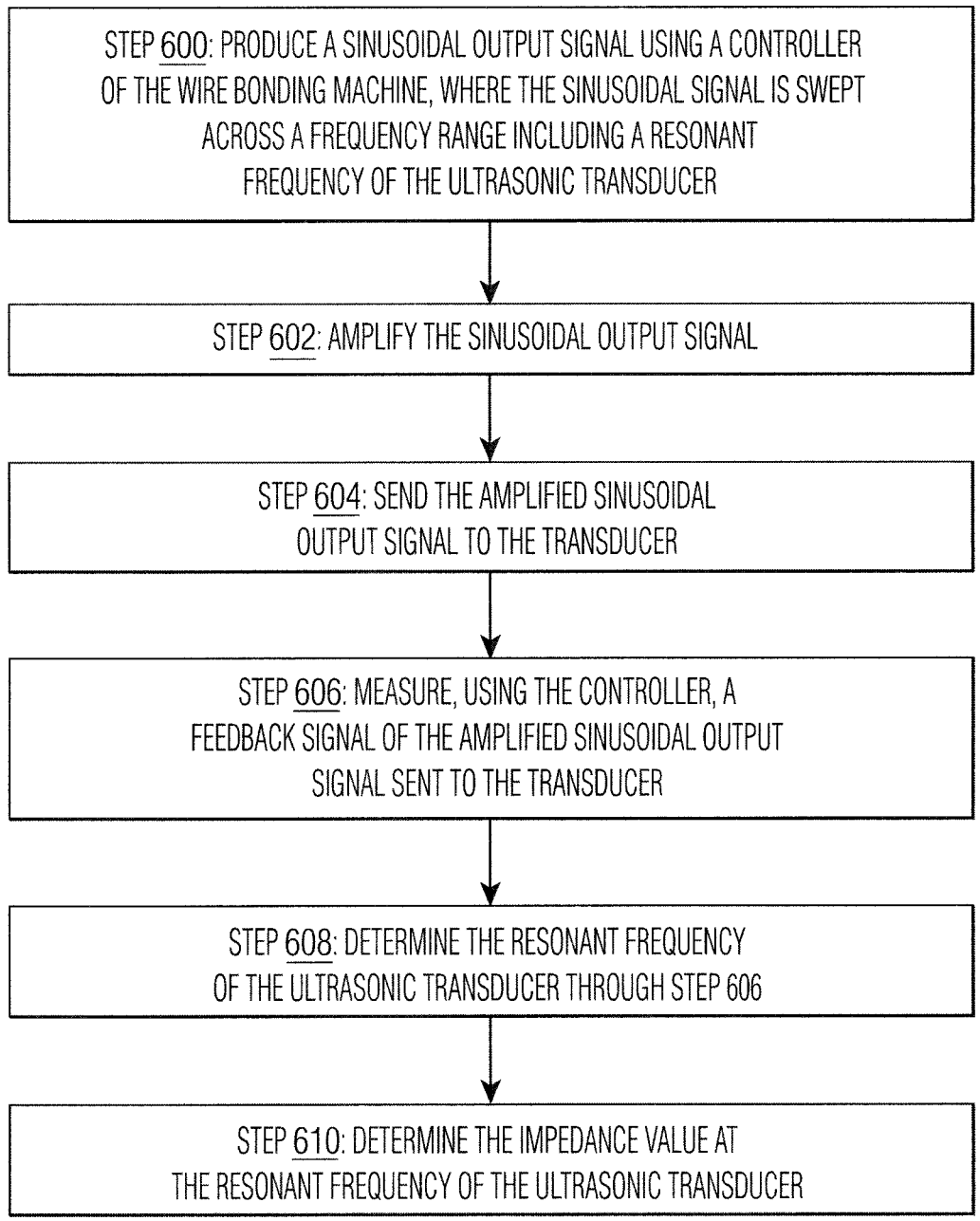
FIG. 6 is a flow diagram illustrating a method of determining an impedance value associated with operation of the ultrasonic transducer in accordance with an exemplary embodiment of the present invention.

FIGS. 4-6 are flow diagrams in accordance with certain exemplary embodiments of the present invention. As is understood by those skilled in the art, certain steps included in the flow diagrams may be omitted; certain additional steps may be added; and the order of the steps may be altered from the order illustrated.

FIG. 4 is a flow diagram illustrating a method of calibrating a voltage for use with an ultrasonic transducer of a wire bonding machine in a constant voltage mode in accordance with an exemplary embodiment of the present invention. At step 400, an impedance value associated with operation of the ultrasonic transducer is determined. For example, this impedance value may not only be the impedance of the ultrasonic transducer, but may also include impedance components related to, for example: coupling of the piezoelectric crystals within the transducer; the electrical connections to the transducer; the mounting of the transducer; the coupling between the bonding tool and the transducer, etc. At step 402, an adjusted voltage level is established for use with the ultrasonic transducer in the constant voltage mode based on the determined impedance value. For example, as described above, a ratio of the actual impedance to a reference impedance may be calculated, and this ratio may be applied to a reference voltage to reach the adjusted voltage. Of course, alternative techniques of adjusting the voltage based on the determined impedance value are contemplated. This adjusted voltage may be the voltage applied to the transducer. In the alternative, at optional step 404, a further adjusted voltage value may be calculated, where the further adjusted voltage is the adjusted voltage multiplied by a portability factor.

FIG. 5 is a flow diagram illustrating another method of calibrating a voltage for use with an ultrasonic transducer of a wire bonding machine in a constant voltage mode in accordance with an exemplary embodiment of the present invention. At step 500, a reference voltage ($V_{ref}$) and a reference impedance ($Z_{ref}$) are established. As provided above, the reference impedance and reference voltage may represent values for a known/representative system. At step 502, an impedance value associated with operation of the ultrasonic transducer is determined ($Z_{actual}$). At step 504, a ratio of the impedance determined in step 502 to the reference impedance is established (i.e., $Z_{actual}/Z_{ref}$). At step 506, an adjusted voltage level is established for use with the ultrasonic transducer in the constant voltage mode by applying the ratio to the reference voltage. This adjusted voltage may be the voltage applied to the transducer. In the alternative, at optional step 508, a further adjusted voltage value may be calculated, where the further adjusted voltage is the adjusted voltage multiplied by a portability factor.

FIG. 6 is a flow diagram illustrating a method of determining an impedance value associated with operation of the ultrasonic transducer in accordance with an exemplary embodiment of the present invention. For example, the method shown in FIG. 6 may be used in connection with Step 400 of FIG. 4, or in connection with step 502 of FIG. 5.

Referring again to FIG. 6, at step 600 a sinusoidal output signal is produced using a controller of a wire bonding machine. The sinusoidal output signal is swept across a frequency range including a resonant frequency of the ultrasonic transducer. At step 602, the sinusoidal output signal is amplified (e.g., using an amplifier of the controller). At step 604, the amplified sinusoidal output signal is sent to the transducer. At step 606, a feedback signal of the amplified sinusoidal output signal is measured using the controller. At step 608, a resonant frequency of the ultrasonic transducer is determined through the measurement of the amplified sinusoidal output signal in step 606. For example, this resonant frequency may be determined by any of a number of techniques (e.g., monitoring the signal current for a current maximum, monitoring the phase difference between the voltage and current of the signal, etc.). At step 610, the impedance value associated with operation of the ultrasonic transducer is determined at the resonant frequency.

The calibration techniques disclosed herein (e.g., the calibration of a constant voltage for use with an ultrasonic transducer) may be performed one time for a given wire bonding machine/system. Alternatively, the calibration techniques may be performed at a given frequency (e.g., at every bond, at every 100 bonds, etc.) or at a given event (e.g., each time a new capillary tool is used, etc.).

Although certain aspects of the present invention are described in connection with a resonant frequency of an ultrasonic transducer, it is known to those skilled in the art that an ultrasonic transducer may have multiple resonant frequencies. As such, these aspects of the present invention may be utilized in connection with any of the resonant frequencies.

Certain exemplary embodiments of the present invention described herein relate to the establishment of an adjusted voltage level for use with the ultrasonic transducer in the constant voltage mode based on an impedance value determined for the subject transducer. In one example, the voltage level is adjusted (based on the impedance value) through the application of a ratio ($Z_{actual}/Z_{ref}$) to a reference voltage. Of course, the voltage level may be adjusted (based on the impedance level) in different ways within the scope of the present invention. For example, the voltage level may be adjusted using a different function or ratio that is based on the impedance value of the subject transducer. Other techniques are also contemplated.

The calibration techniques of the present invention may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the calibration techniques.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of calibrating a voltage for use with an ultrasonic transducer of a wire bonding machine in a constant voltage mode, the method comprising the steps of:
   (1) determining an impedance value associated with operation of the ultrasonic transducer of a wire bonding machine; and
   (2) establishing an adjusted voltage level to replace a reference voltage level for use with the ultrasonic transducer in the constant voltage mode based on the determined impedance value, the adjusted voltage level being a voltage setpoint to be applied to the ultrasonic transducer during operation in the constant voltage mode.

2. The method of claim 1 further comprising a step of establishing a reference impedance value, and establishing a ratio of the impedance value determined in step (1) to the reference impedance value ($Z_{actual}/Z_{ref}$), whereby the adjusted voltage level is established in step (2) by applying the ratio to the reference voltage level.

3. The method of claim 1 wherein step (1) includes measuring a current signal passing through the ultrasonic transducer such that a maximum current value may be detected, and then determining the impedance value at the maximum current value.

4. The method of claim 1 wherein step (1) includes measuring a phase difference between the current and voltage of a signal passing through the ultrasonic transducer such that when the phase difference is substantially zero the impedance value may be determined at step (1).

5. The method of claim 1 wherein step (1) includes (a) producing a sinusoidal output signal using a controller of the wire bonding machine, where the sinusoidal signal is swept across a frequency range including a resonant frequency of the ultrasonic transducer; (b) amplifying the sinusoidal output signal; (c) sending the amplified sinusoidal output signal to the transducer; (d) measuring, using the controller, a feedback signal of amplified sinusoidal output signal sent to the transducer; (e) determining the resonant frequency of the ultrasonic transducer through step (d); and (f) determining the impedance value at the resonant frequency of the ultrasonic transducer.

6. The method of claim 5 wherein step (e) includes measuring a current value of the feedback signal, and determining the resonant frequency by determining a maximum current value of the feedback signal.

7. The method of claim 5 wherein step (e) includes measuring a phase difference between a current and a voltage of the feedback signal, and determining the resonant frequency when the phase difference is substantially zero.

8. The method of claim 1 wherein step (1) includes (a) determining a resonant frequency of the ultrasonic transducer; and (b) determining the impedance value at the resonant frequency of the ultrasonic transducer.

9. The method of claim 1 further comprising the step of:
   (3) further adjusting the adjusted voltage level using a portability factor determined in connection with operation of the ultrasonic transducer.

10. A computer readable carrier including computer program instructions which cause a computer to implement a method of calibrating a voltage for use with an ultrasonic transducer of a wire bonding machine in a constant voltage mode, the method comprising the steps of:
   (1) determining an impedance value associated with operation of the ultrasonic transducer of a wire bonding machine; and
   (2) establishing an adjusted voltage level to replace a reference voltage level for use with the ultrasonic transducer in the constant voltage mode based on the determined impedance value, the adjusted voltage level being a voltage setpoint to be applied to the ultrasonic transducer during operation in the constant voltage mode.

11. A wire bonding system comprising:
   an ultrasonic transducer; and
   a controller, the controller being configured to (1) determine an impedance value associated with operation of the ultrasonic transducer, and (2) establish an adjusted voltage level to replace a reference voltage level for use with the ultrasonic transducer in a constant voltage mode based on the determined impedance value, the adjusted voltage level being a voltage setpoint to be applied to the ultrasonic transducer during operation in the constant voltage mode.

12. The wire bonding system of claim 11 wherein the wire bonding system includes a reference impedance value stored in memory, and wherein the controller is configured to establish a ratio of the impedance value to the reference impedance value ($Z_{measured}/Z_{reference}$), and wherein the controller is configured to establish the adjusted voltage level by applying the ratio to the reference voltage level.

13. The wire bonding system of claim 11 wherein the controller is configured to measure a current signal passing through the ultrasonic transducer such that a maximum current value may be detected, and then the controller determines the impedance value at the maximum current value.

14. The wire bonding system of claim 11 wherein during the determination of the impedance value associated with operation of the ultrasonic transducer, the controller is configured to measure a phase difference between a current and a voltage of a signal passing through the ultrasonic transducer such that when the phase difference is substantially zero the impedance value is determined.

15. The wire bonding system of claim 11 wherein during the determination of the impedance value associated with operation of the ultrasonic transducer, the controller is configured to (a) produce a sinusoidal output signal swept across a frequency range including a resonant frequency of the ultrasonic transducer; (b) amplify the sinusoidal output signal; (c) send the amplified sinusoidal output signal to the transducer; (d) measure a feedback signal of amplified sinusoidal output signal sent to the transducer; (e) determine the resonant frequency of the ultrasonic transducer; and (f) determine the impedance value at the resonant frequency of the ultrasonic transducer.

16. The wire bonding system of claim 15 wherein during step (e), the controller is configured to measure a current value of the feedback signal, and determine the resonant frequency by determining the maximum current value of the feedback signal.

17. The wire bonding system of claim 15 wherein during step (e), the controller is configured to measure a phase difference between the current and voltage of the feedback signal, and to determine the resonant frequency when the phase difference is substantially zero.

18. The wire bonding system of claim 11 wherein during the determination of the impedance value associated with operation of the ultrasonic transducer, the controller is configured (a) determine a resonant frequency of the ultrasonic transducer; and (b) determine the impedance value at the resonant frequency of the ultrasonic transducer.

19. The wire bonding system of claim 11 wherein the controller is configured to further adjust the adjusted voltage level using a portability factor determined in connection with operation of the ultrasonic transducer.

20. The method of claim 1 wherein step (1) includes determining an impedance value associated with operation of the ultrasonic transducer at a resonant frequency of the ultrasonic transducer of the wire bonding machine.

* * * * *